United States Patent [19]

Vosicky

[11] 3,943,504

[45] Mar. 9, 1976

[54] ELECTRIC MOTOR DIRECTION INDICATING DEVICE

[75] Inventor: Jan Vosicky, Media, Pa.

[73] Assignee: Westinghouse Electric Corporation, Pittsburgh, Pa.

[22] Filed: Feb. 25, 2975

[21] Appl. No.: 552,832

[52] U.S. Cl.............. 340/271; 318/490; 324/34 R; 324/158 MG
[51] Int. Cl.²......................................... G01B 7/00
[58] Field of Search ....... 340/271; 318/490; 322/99; 324/158 MG

[56] References Cited
UNITED STATES PATENTS

| | | | |
|---|---|---|---|
| 2,669,126 | 2/1954 | Simmons et al. | 340/271 X |
| 2,786,978 | 3/1957 | Warner | 340/271 X |
| 2,924,773 | 2/1960 | Lykke | 324/158 MG |
| 3,111,841 | 11/1963 | Gray | 340/271 X |
| 3,120,655 | 2/1964 | Beason et al. | 340/271 |
| 3,123,818 | 3/1964 | Steele | 340/271 X |
| 3,188,620 | 6/1965 | MacCallum | 340/271 X |

*Primary Examiner*—David L. Trafton
*Attorney, Agent, or Firm*—George M. Medwick

[57] ABSTRACT

A direction indicating device for indicating the direction of rotation of a polyphase A.C. electric motor. A polyphase energy source having a frequency higher than the operating frequency of the electric motor impresses a rotating electromagnetic field in the windings of the motor. A pair of coil detectors, spaced a predetermined electrical distance apart, detects the rotating electromagnetic field and determines the direction of rotation of the electromagnetic field. The direction of rotation of the electromagnetic field, which is the same as the rotation of the electric motor, is displayed on a display apparatus.

9 Claims, 2 Drawing Figures

ELECTRIC MOTOR DIRECTION INDICATING DEVICE

BACKGROUND OF THE INVENTION

1. Field of the Invention:

This invention relates to A.C. electric motors, and in particular, to an arrangement for detecting the direction of rotation of an electric motor.

2. Description of the Prior Art:

In general, direction of rotation of an A.C. electric motor is a parameter which is usually not critical to the operation of the motor itself. For this reason, manufacturing procedures are such that no strict supervision is utilized to guarantee that the direction of rotation of the electric motor be precisely determined. Since the possible sources during construction which affect the rotation of the motor are many, and since the reasons for determining the direction of rotation are not important, the direction of rotation of a fabricated A.C. electric motor is usally unknown.

However, for example, when an electric motor is to be utilized in conjunction with a starting package for a gas turbine power plant, the direction of rotation of the electric motor assumes critical importance. This is due to the type of apparatus usually associated with the motor in the starting package. Associated apparatus, such as an oil pump, or a torque converter, is usually quite sensitive to the direction of rotation of its drive motors. It is possible in some situations to severely damage the associated apparatus by impressing thereon a direction of rotation in opposition to the direction of rotation that is desired.

For this reason, it is imperative that the direction of rotation of the electric motor be ascertained before it is energized and employed in the gas turbine starting package. In the prior art, one method of determining the direction of the electric motor in the starting package was to first de-couple the motor from its associated apparatus. The motor could then be energized and its direction of rotation ascertained. If the direction of rotation was incorrect, the simple expendient of changing the leads from the energy source to the starter motor would insure correct direction of rotation. However, this method proves disadvantageous in that it involves the time-consuming, and therefore costly, de-coupling procedures before the starter motor can be isolated from the associated apparatus tested. This of course, assumes that the coupling is easily reachable by work personnel. Once the proper rotation is insured, the motor must be re-coupled to the associated apparatus, with the attendant time-consumption and costs.

The prior art has also determined the direction of motor rotation by turning the starter motor while it is still connected to the associated apparatus. However, as mentioned earlier, this method of determining direction is not always advantageous in that it is possible to severely damage the associated apparatus by rotating it in a direction not in accord with the desired direction of rotation. Such a hit-and-miss test strategy, with the attendant danger of damage to the associated apparatus, is clearly not an effective method of determining motor rotation.

A third method of determining rotational direction of an electric motor utilized by the prior art is to connect a galvanometer, or another similar device, to the terminals of the electric motor. The motor shaft was then manually rotated and the current so induced is detected by the galvanometer and the direction of motor rotation could be determined by the deflection of the galvanometer needle. This method is useful when working with motors of smaller sizes, but is extremely cumbersome when utilized with the large, 1500 horsepower motors utilized in starting packages for a gas turbine power plants.

SUMMARY OF THE INVENTION

This invention relates to a direction indicating arrangement for indicating the direction of an A.C. polyphase electric motor as for example, for a motor used in a starting package for a gas turbine power plant. The electric motor is usually operable at a predetermined rated frequency. A source of electrical energy, having a frequency greater than the rated frequency of operation of the electric motor, is connected to the electric motor and produces a rotating electromagnetic field within the windings of the electric motor. A pair of coil pick-ups detect the leaking electromagnetic field within the windings of the electric motor and a current is thereby induced in each of the coil pick-ups. A phase detector detects the phase relationship between the currents induced in the coil pick-ups. The phase shift between the currents in the first and the second coil pick-ups indicate the direction of rotation of the electromagnetic field within the motor windings. This, in turn, directly indicates the direction of rotation of the A.C. motor itself. The direction of rotation of the rotating electromagnetic field, and hence the direction of the motor itself, is displayed on a suitable display apparatus.

It is an object of this invention to provide an arrangement which indicates the direction of rotation of a polyphase A.C. electric motor without requiring a start-up of the motor. Other objects will be apparent from the description of the preferred embodiment herein.

BRIEF DESCRIPTION OF THE DRAWINGS

The invention will be more fully understood from the following detailed description of an illustrative embodiment taken in connection with the accompanying drawings, in which.

DESCRIPTION OF THE PREFERRED EMBODIMENT

Figure 1:
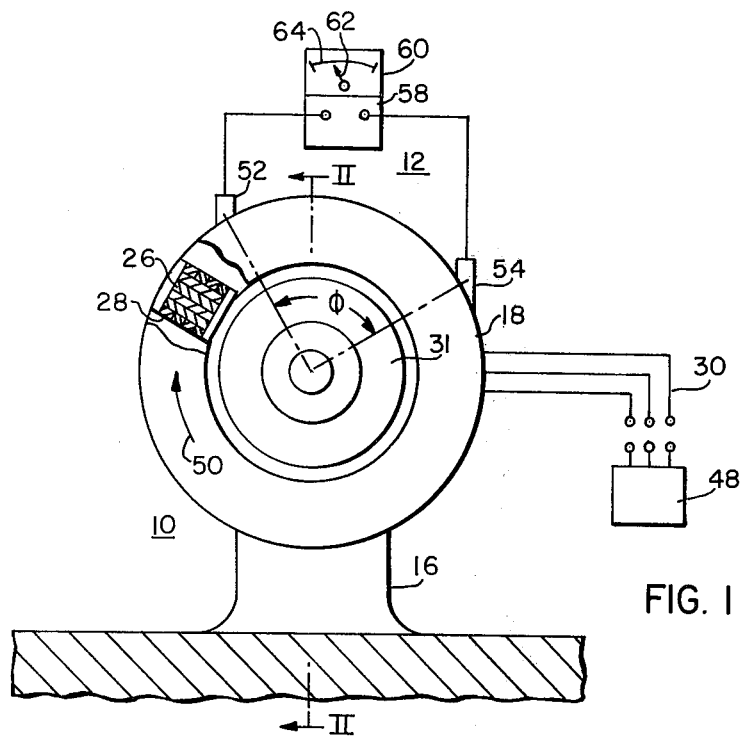
FIG. 1 is a front elevational view, partly in section, of a polyphase A.C. electric motor having a direction indicating arrangement thereon embodying the teachings of this invention; and, FIG. 2 is an elevational view taken along lines II—II of FIG. 1 showing the electric motor in the environment of a starting package for a gas turbine power plant.

Throughout the following description, similar reference characters refer to similar elements in all figures of the drawings.

Figure 2:
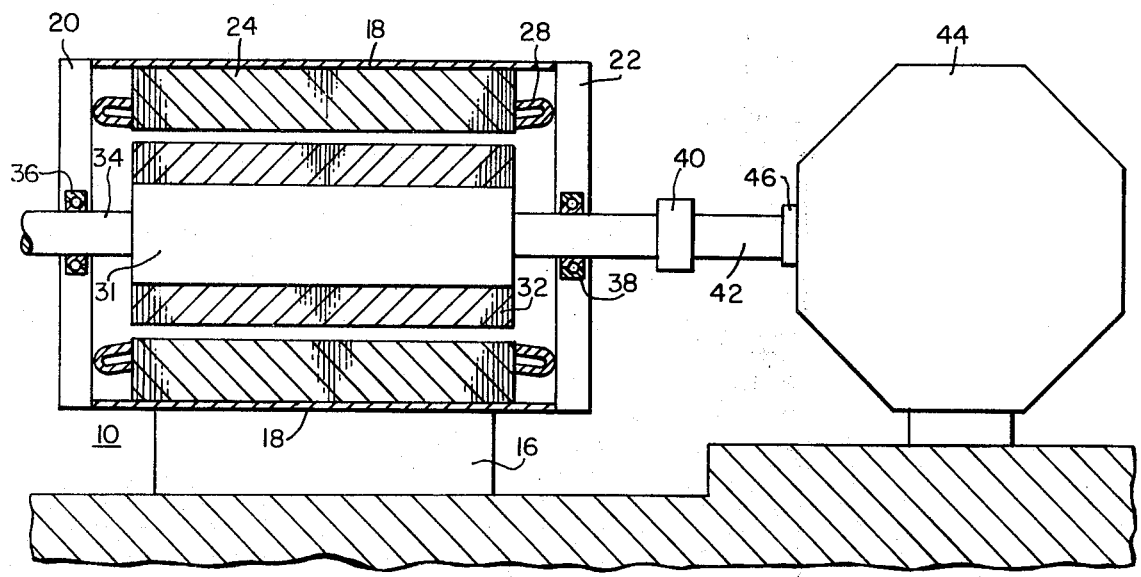

Referring to the drawings, in FIG. 1, a front elevational view, partially in section, of an electric motor 10 having thereon a direction indicating arrangement 12 embodying the teachings of this invention. In FIG. 2, the motor 10 is shown in section taken along lines II—II of FIG. 1 and is shown as disposed in the environment of a starting package for a gas turbine power plant. As seen in the figures, the motor 10 is mounted on a suitable motor support 16. An outer casing 18 having a first end cover 20 and a second end cover 22 is connected to the casing 18. The casing 18, with end covers 20 and completly enclose a stator 24 is fabricated of a plurality of metal laminations 26 and has stator windings 28 electrically connected in a predetermined manner disposed thereon. A plurality of terminals 30 permit electrical connection of the stator winding 28 to an electrical energy source (not shown).

A rotor member 31 having a predetermined winding arrangement 32 thereon is supported within the motor 10 on a shaft 34. Bearings 36 and 38 are disposed in the end covers 20 and 22 respectively, and facilitate rotation of the shaft 36. The shaft 34 as shown in FIG. 2 is mechanically connected through coupling 40 to a shaft 42 of an associated apparatus 44 which is part of the starting package for the gas turbine power plant. A one-way gasket 46 is disposed on the apparatus 46 which functions as a seal while the shaft 42 is rotating in one predetermined direction only.

During manufacture of the electric motor 10, any number of construction details could impart a different direction of rotation to the finally fabricated motor. For example, insertion of the stator winding 24 may be done in such a way so that energization of the terminals 30 by the electrical energy source (not shown) could result in a direction of rotation of the motor 10 in one direction. However, if the stator 24 were inserted in the opposite direction, energization of the terminals 30 would result in an opposite direction of rotation. It is thus seen that method of insertion of the stator 24 or phase connection or any of several other factors, determines the direction of rotation of the electric motor 10.

Since, in general, it is not critical in which direction the motor 10 itself is to rotate, manufacturing procedures are usually not so stringent as to require exact methods of assembly so that the direction of rotation of the motor 10 be a known parameter.

However, when the motor 10 is used, as, for example, in the starting package of a gas turbine power plant and coupled to an associated apparatus 44, the direction or rotation of the motor 10 becomes critically important. Thus, it is of great importance to be able to determine the direction of the rotation of motor 10. One reason for this, as was mentioned earlier, is that the gasket 46 forms when the shaft 42 rotates in one direction only. If the direction of rotation of the shaft 34 of the electric motor 10 differed from permitted direction of rotation of the shaft 42, damage to the gasket 46 and very possibly to the associated apparatus 46 would result. It is for this reason that the precise direction of rotation of the electric motor 10 utilized in the starting package (now shown) for the gas turbine power plant (not shown) must be known.

This invention provides a direction indicating arrangement 12 which is able to indicate the direction of rotation of the motor 10. As seen in FIG. 1, the terminals 30 are shown connected to a high frequency oscillator 48 which produces a three-phase electrical signal having a predetermined frequency. The frequency of the signal produced by the source oscillator 48 is much greater than the rated operational frequency of the motor 10. The oscillator frequency is any number in the range between 400 and 20,000 Hz. The signal introduced into the motor 10 through the terminals 30 is a low power signal that is not sufficient to move the motor 10.

Introduction of the three phase, high frequency, low power field into the electric motor 10 will produce an electromagnetic field which will rotate through the windings 28 of the stator 24 in the same fashion as a standard 60 Hz field. The only difference between the high frequency signal and the normal 60 Hz signal is the frequency of rotation of the electromagnetic field through the stator windings 28. Although the stator windings 28 are, technically, energized by the low power, three phase, high frequency signal from the oscillator 48, it is to be understood that the signal impressed on the windings 28 does not provide sufficient power to move the motor 10.

The frequency of the oscillator 48 is much higher than an optimum predetermined frequency of operation of the motor 10. Since the impedance of the motor 10 is dependent upon the frequency, and since the impedance to current flow for a high frequency signal is greater than the impedance to current flow encountered by a lower frequency signal, the electromagnetic field impressed upon the stator windings 28 by the oscillator 48 develops unevenly.

The effect of impressing a high frequency, low power, electric signal from the oscillator 48 into the windings 28 of the stator 24 would be to introduce an electromagnetic field rotating at the input frequency in the stator coil 28. The direction of rotation of the electromagnetic field in the stator windings 28 is illustrated by an arrow 50. Since the input frequency from the oscillator 48 is higher than the rated frequency for the motor 10, a fringe field produced by the high frequency signal will develop. The fringe field produced by the high frequency signal is greater than the fringe effects of the electromagnetic field produced in the windings by the normal design frequency.

It may be possible in some instances to use the normal design frequency of the motor 10 in order to determine the direction of rotation of the motor 10. With a 60 Hz. signal, a 1500 horsepower motor, for example, 4160 volts are needed in order to move the motor 10. It is possible with a 60 Hz. three-phase signal having an input voltage of only 48 volts to detect a significant fringe field which is greater than the fringe field of a motor with the design frequency and input voltage. However, as the frequency decreases, detection of the fringe field will become more difficult. This is especially true in the case of the low power, high frequency signal is to introduce a rotating electromagnetic field in the direction 50 within the rotor winding 24. It is well known to those skilled in the art that the direction of rotation of the electromagnetic field within the stator winding 28 will indicate the direction of rotation of the rotor 31 of the electric motor 10. Therefore, to identify the direction of rotation of the field in the windings 28 of the motor 10 is to discern the direction of rotation of the motor 10.

In order to detect the rotating electromagnetic field within the stator windings 28, a first electromagnetic signal pick-up coil 52 and a second electromagnetic signal pick-up coil 54 are disposed at a predetermined electrical distance apart. This electrical distance is obtained by separating the coil pick-ups by an angle $\phi$. It is essential that the first coil pick-up 52 and the second coil pick-up 54 be disposed some predetermined electrical distance $\phi$ from one another. If for example, only one electrical signal pickup coil was utilized, the effect of such use would be to merely detect that a fringe field is present in the windings 28 in the motor 10. It is essential that the first coil pick-up 52 and the second coil pick-up coil 54 be displaced an electrical distance $\phi$ in order to properly detect and discern the fringe field generated by the rotating electromagnetic field within the stator windings 28.

The first electrical coil pick-up 52 and the second electrical coil pick-up 54 are connected to a phase detector 58 having a display screen 60 thereon. The fringe field produced by the rotating electromagnetic field within the stator winding 28 induces a current in the first electromagnetic coil pick-up 52. The fringe field produced by the rotating electromagnetic field within the stator winding 28 induces a second current within the second electromagnetic coil pickup 54, which is spaced a predetermined electrical distance $\phi$ from the first electromagnetic coil pick-up 52. The first current induced within the first electromagnetic pick-up 52 and the second current induced within the second electromagnetic pick-up 54 are both introduced into the phase detector 58.

Within the phase detector 58, electronic circuitry detects the phase shift between the current induced in the first electromagnetic coil pick-up 52 and the current induced in the second electromagnetic coil pick-up 54 by the fringe field produced by the rotating electromagnetic field in the stator windings 28. The phase displacement discerned by the phase 58 between the first current and the second current will be the same electrical displacement as the electrical displacement $\phi$ between the first coil pick-up 52 and the second coil pick-up 54.

By discerning which of the induced current waves leads the other, it is possible to discern the direction of rotation of the electromagnetic field within the stator windings 28. For example, if the electromagnetic field within the stator winding 28 is rotating in the direction 50 as shown in FIG. 2, the current induced in the second electromagnetic coil pick-up 54 will lead the current induced in the first electromagnetic pick-up 52. Of course, if the direction of rotation of the electromagnetic field is opposite the direction 50, the current induced in the first electromagnetic pick-up 52 will lead the current induced in the second electromagnetic coil pick-up 54.

Within the phase detector 58, differential voltages associated with the differential current are introduced into the display meter 60 and the deflection of an indicator needle 62 and a meter scale 64 will indicate in which direction the rotating electromagnetic field is moving within the stator windings 28. As mentioned before, detection of the direction of rotation of the electromagnetic field within the stator windings 28 will indicate the direction of rotation of the motor 10.

It is thus seen that by utilizing the teachings of this invention the direction of rotation of an electric motor can be ascertained. Through the use of a high frequency, low power signal to produce a rotating electromagnetic field within the windings 28 of the motor 10, and detection of the fringe roatating electromagnetic field produced thereby, the direction of rotation of the rotating electromagnetic field, and hence the direction of rotation of the electric motor 10 itself, may be discerned.

I claim as my invention:

1. A direction indicating device for indicating the direction of rotation of an A.C. electric motor having windings thereon, said device comprising;
    a source of electrical energy producing an electromagnetic field within said windings,
    means for sensing said electromagnetic field in said windings, and
    display means for indicating the direction of movement of said electromagnetic field in said windings, the direction of movement of said electromagnetic field in said winding indicating the direction of rotation of said motor.

2. The device of claim 1, wherein said A.C. electric motor is operable at a first predetermined frequency, and wherein said source of electrical power is operable at a second predetermined frequency.

3. The device of claim 2 wherein said second predetermined frequency is greater than said first predetermined frequency.

4. The device of claim 1, wherein said sensing means comprises a first coil pick-up and a second coil pick-up, said second coil pick-up being displaced a predetermined electrical distance from said first coil, pick-up, said electromagnetic field inducing a first electric current in said first coil and a second electric current in said second coil, said first electric current in said first coil having a predetermined phase relationship with said second current induced in said second coil.

5. The device of claim 4, wherein said display means comprises means for detecting the phase relationship between said first current and said second current, said phase relationship between said first current and said second current indicating the direction of rotation of said electromagnetic field, the direction of rotation of said electromagnetic field indicating the direction of rotation of said electric motor.

6. A gas turbine power plant comprising:
    a starting package having an A.C. electric motor disposed therein, said electric motor having windings thereon, and,
    an indicating device for indicating the direction of rotating of said electric motor, said indicating device comprising;
    an electrical energy source producing an electromagnetic field in said winding,
    means for sensing said electromagnetic field in said windings at a first and a second point, said electromagnetic field inducing a first and a second electric current in said sensing means, and,
    means for comparing the phase relationship between said first and said second electric currents to indicate thereby the direction of rotation of said electric motor.

7. A method of determining the direction of rotation of an electric motor comprising the steps:
    a. energizing the windings of said electric motor to produce a rotating electric field therein, and
    b. sensing the direction of rotation of said rotating electric field, said direction of rotation of said electric field corresponding to said direction of rotation of said electric motor.

8. The method of claim 7 wherein said motor has windings therein and operates at a predetermined frequency, and wherein step (a) comprises the steps
    connecting an electric signal source to said windings, and,
    impressing an electric signal having a frequency greater than said predetermined frequency in said windings.

9. The method of claim 8, wherein step (b) comprises the steps
    detecting the rotating electric field at a first location in said windings
    detecting the rotating electric field at a second location in said windings comparing the phase relationship between currents induced by the rotating field at the first and second locations to determine the direction of rotation of the field within said windings.

* * * * *